United States Patent [19]
Sode et al.

[11] Patent Number: 6,006,348
[45] Date of Patent: Dec. 21, 1999

[54] FLIP FLOP CIRCUIT FOR SCAN TEST WITH TWO LATCH CIRCUITS

[75] Inventors: Mikiko Sode; Yoichi Iizuka, both of Tokyo, Japan

[73] Assignee: NEC Corporation, Tokyo, Japan

[21] Appl. No.: 09/030,917

[22] Filed: Feb. 26, 1998

[30] Foreign Application Priority Data

Feb. 26, 1997 [JP] Japan ..................................... 9-042110

[51] Int. Cl.⁶ .................................................. G06F 11/06
[52] U.S. Cl. ........................................... 714/731; 714/729
[58] Field of Search .............................. 371/22.31, 22.1, 371/22.5; 714/726, 729, 231

[56] References Cited

U.S. PATENT DOCUMENTS

| | | | |
|---|---|---|---|
| 4,495,629 | 1/1985 | Zasio et al. ................................ | 377/70 |
| 5,175,447 | 12/1992 | Kawasaki et al. ...................... | 307/480 |
| 5,527,223 | 6/1996 | Dervisoglu .............................. | 365/154 |
| 5,598,120 | 1/1997 | Yurash .................................... | 327/202 |
| 5,838,693 | 11/1998 | Morley .................................. | 371/22.31 |

FOREIGN PATENT DOCUMENTS 5-75401  3/1993  Japan.

*Primary Examiner*—Emmanuel L. Moise
*Assistant Examiner*—Esaw Abraham
*Attorney, Agent, or Firm*—Foley & Lardner

[57] ABSTRACT

A flip flop circuit for a scan test comprises a first latch circuit for latching and outputting data signal D in synchronization with control signal CLK when control signal SC1 is set at one level and latching and outputting scan in data signal SIN in synchronization with control signal SC1 when control signal CLK is set at the other level, and a second latch circuit for latching and outputting an output of the first latch circuit in synchronization with control signal CLK when control signal SC2 is set at one level and latching and outputting an output of the first latch circuit in synchronization with control signal SC2 when control signal CLK is set at the other level. In this way, the area of the circuit is decreased by commonly using one latch circuit for a data signal and a scan in data signal. Also, the skew adjustment is not required during a scan test by operating with two-phase clocks during both scan shift operation and scan normal operation.

6 Claims, 7 Drawing Sheets

FLIP FLOP CIRCUIT FOR SCAN TEST WITH TWO LATCH CIRCUITS

BACKGROUND OF THE INVENTION

1. Field of the Invention

The present invention relates to a scan flip flop circuit for allowing a test of a scan test scheme, which is incorporated in a semiconductor integrated circuit.

2. Description of the Related Art

In recent years, semiconductor integrated circuits tend to have increasingly larger scales. Also, circuits with various functions such as adders, multipliers, RAMs, ROMs or the like have been incorporated in semiconductor integrated circuits.

In such a semiconductor circuit, an input signal is outputted via a number of functional circuits in the semiconductor integrated circuit, so that when malfunction occurs, it is difficult to presume in which functional circuit the malfunction occurs.

Thus, in the semiconductor integrated circuit in which a number of functional circuits are incorporated, for example, all or some of normal flip flops are replaced with scan flip flops and a test of a scan test scheme is performed with predetermined data set up in these scan flip flops to verify the circuit operation. In such a semiconductor integrated circuit, the circuit is operated in synchronization with a system clock for controlling the entire system during a normal operation. In contrast, the scan flip flop inputs, holds and outputs data for a scan test (scan in data) or an output of the functional circuit at the preceding stage to allow the test for the logical operation of each functional circuit during the scan test operation.

This type of circuit for performing the scan test is conventionally known as a scan flip flop circuit (hereinafter referred to as an SFF) and illustrated in FIG. 1.

This circuit comprises three latch circuits of a first through a third latch circuits. First latch circuit 114 is provided with data signal D and control signal CLK at data signal input terminal H01, and control signal input terminal H02, respectively, latches data signal D in synchronization with this control signal CLK, and delivers an output signal from data signal output terminal Q01. To transfer gates 91 and 92 are connected output P01 of inverter 110 and output P02 of inverter 111, respectively.

Second latch circuit 115 is provided with scan in data signal SIN and control signal SC1 at data signal input terminal H03, and control signal input terminal H04, respectively, and latches the scan in data signal SIN in synchronization with this control signal SC1, and delivers a second output signal from data signal output terminal Q03. To transfer gates 93 and 94 are connected both control signal input terminal H04 and output P03 of inverter 112.

Next, third latch circuit 116 consists of transfer gate 95 connected to data output terminal Q01 of first latch circuit 114, transfer gate 96 connected to data output terminal Q03 of second latch circuit 115, and further, transfer gates 97 and 98. Among them, to the transfer gates 95 and 97 are connected both outputs P01 and P02 similar to those used in first latch circuit 114, and to the transfer gates 96 and 98 are connected both control signal input terminal H05 inputted with control signal SC2 and output CB1 of inverter 113. Third latch circuit 116, when control signal SC2 is set up at a low level, latches the output signal of first latch circuit 114 in synchronization with control signal CLK and delivers output signals at data signal output terminals N01 through N03. Also, when control signal CLK is set up at a low level, third latch circuit 116 latches the output signal of second latch circuit 115 in synchronization with control signal SC2 and delivers output signals at data signal output terminals N01 through N03.

As described above, the conventional SFF circuit comprises three latch circuits. When this SFF circuit is assembled on a gate array with a substrate of a predetermined size, one cell is required for two transfer gates, one cell for each of output buffers 102 and 105 of the third latch circuit, and one cell for two inverters for the remaining ones. Thus, the circuit showed in FIG. 1 comprises 12.5 cells, or practically about 13 cells.

Next, the scan test operation of this circuit will hereinafter be described in reference to FIG. 1 and waveforms of the control signals as shown in FIG. 2.

First, a scan shift operation indicates that all sequential circuits are rearranged to form a SFF of register construction and scan in data is inputted from outside to be written to the SFF and the data of the SFF is outputted to the outside.

In second latch circuit 115, control signal SC1 is first inputted at 0 (low level) so that the transfer gate 93 is closed. Control signal SC1 is then changed to 1 (high level), transfer gate 93 is opened to fetch data SIN. Control signal SC1 is then changed to 0, transfer gate 93 is closed to open transfer gate 94 and data SIN is latched.

During this operation, in third latch circuit 116, control signal CLK is equal to 0 so that transfer gate 95 is closed and transfer gate 97 is opened. Also, transfer gate 96 is closed while control signal SC2 is inputted at 0. Then, control signal SC2 is changed to 1 and transfer gate 96 is opened to input the output signal of second latch circuit 115. When control signal SC2 is again changed to 0, transfer gate 96 is closed and transfer gate 98 is opened and then the inputted signal is latched and outputted from the output terminals.

In this way, the conventional SFF operates with the two-phase clocks of the SC1 and the SC2 during the scan shift operation.

Next, a scan normal operation will be described. The scan normal operation indicates that combination circuits of a semiconductor integrated circuit (portions excepting the SFF) are operated using an output value of the SFF and the result is written to the SFF.

In third latch circuit 116, control signal SC2 is inputted at 0 so that transfer gate 96 is closed and transfer gate 98 is opened. While control signal CLK is inputted at 0, transfer gates 91 and 97 are opened and the transfer gates 92 and 95 are closed, and the preceding cycle value is outputted.

Then, when control signal CLK is changed to 1, transfer gates 92 and 95 are opened, transfer gates 91 and 97 are closed, the inputted value is latched in first latch circuit 114, transmitted to third latch circuit 116 and outputted therefrom.

When the control C is changed to 0, transfer gates 91 and 97 are opened and transfer gates 92 and 95 are closed, the inputted value is latched in third latch circuit 116 and outputted therefrom.

In other words, during the scan normal operation, the SFF operates with the one-phase clock of the CLK.

In this way, the conventional circuit operates with the two-phase clocks of the SC1 and the SC2 during the scan shift operation, and operates with the one-phase clock of the CLK during the scan normal operation. It should be noted that the conventional circuit also operates with the one-phase clock of the CLK during a user mode because it operates as a normal flip flop.

When the scan circuit is incorporated in an integrated circuit, the most difficult problem is that the area of the integrated circuit is increased as the scan circuit is incorporated in an ordinary circuit. For example, though an ordinary circuit can be formed using a substrate with a predetermined size, a circuit having an incorporated scan circuit may have to be formed using a substrate greater than that for the ordinary circuit, resulting in an increased cost. The scan circuit is classified roughly into a control circuit, a simultaneous operation control circuit and an SFF, and the SFF has the greatest effect on the area of the circuit among them. Thus, it is important to minimize the area of the SFF.

In addition, when the one-phase clock is used in the scan operation of a circuit, the adjustment of clock skew is required for a normal operation of the circuit. The clock skew is a delay of the clock due to wiring delay and so on. In recent years, the method which utilizes a CTS is widely used for adjusting the clock skew. In the CTS, as described simply, buffers are provided on the way of the clock distribution lines, or the length and the shape of the clock distribution lines are arranged so that the clock skew becomes uniform. The details of the CTS are described in LSI LOGIC LCA 500K, Preliminary Design Manual, Chapter 8. However, even though the use of the CTS causes the skew to be decreased, a number of flip flops may operate at the same time to make it difficult to perform the scan shift operation due to the power noises.

Further, when a user uses a plurality of clocks and the waveforms of the clocks are different one another, the same waveform is inputted to the clock terminals of all the SFFs during the scan normal operation since the one-phase clock is used, and, therefore, the circuit may not operate normally because a data passing through without latching occurs.

In the scan test, the FFs (flip flop) are replaced by the SFFs. Since the replacement is usually done after a design of all of circuits is finished, it is important that a time-delay in the user logical portion is not changed. However, the time-delay is changed in many cases since the SFFs are formed by adding a scan function to the usual FFs, and a readjustment of the time-delay was necessary for the user circuits after the replacement.

SUMMARY OF THE INVENTION

It is an object of the present invention to decrease the area of a substrate for a semiconductor integrated circuit by commonly using a single latch circuit for latching a data signal D and a scan in data signal SIN instead of using two latch circuits for each signal in contrast with the above-mentioned prior art requiring three latch circuits. It is another object of the present invention to eliminate the necessity of skew ensuring during a scan operation by operating the scan test with two-phase clocks both during a scan shift operation and a scan normal operation and setting up the time difference between the two-phase clocks in an appropriate length.

In accordance with the present invention, a scan flip flop comprises a first latch circuit for latching a first or a second data signals, and a second latch circuit for latching and outputting the latched signal latched in the first latch circuit.

The first latch circuit is provided with a first data input terminal to which a first data signal is supplied, a second data input terminal to which a second data signal (scan in data signal) is supplied, a first control signal input terminal to which a first control signal is supplied, a second control signal input terminal to which a second control signal is supplied and a data signal output terminal for outputting a latched signal. The first latch circuit latches the first data signal and outputs the signal to the data signal output terminal in synchronization with the first control signal when the second control signal is set at a certain level. Also, the first latch circuit latches the second data signal and outputs the signal to the data signal output terminal in synchronization with the second control signal when the first control signal is set at a certain level. The second latch circuit is provided with a third data signal input terminal to which the latched signal from the data signal output terminal is supplied, a third control signal input terminal to which a third control signal is supplied, a fourth control signal input terminal to which the first control signal is supplied and at least one data signal output terminal for outputting the latched signal from the first latch circuit. The second latch circuit latches the latched signal and outputs the signal to the at least one data signal output terminal in synchronization with the third control signal when the third control signal is set at a certain level.

In particular, in the present invention, the area of a substrate is decreased by using a control signal obtained by the NAND of the first control signal and the third control signal in the second latch circuit to decrease the number of transfer gates, and the circuit operates with two-phase clocks also in the scan normal operation.

In addition, in the present invention, the user mode and the scan test operation can realize the substantially same operating speed since no blocks (elements) for a scan test are added on the lines between inputs and outputs used for a ordinary user circuit.

DETAILED DESCRIPTION OF THE PREFERRED EMBODIMENT

Figure 3:
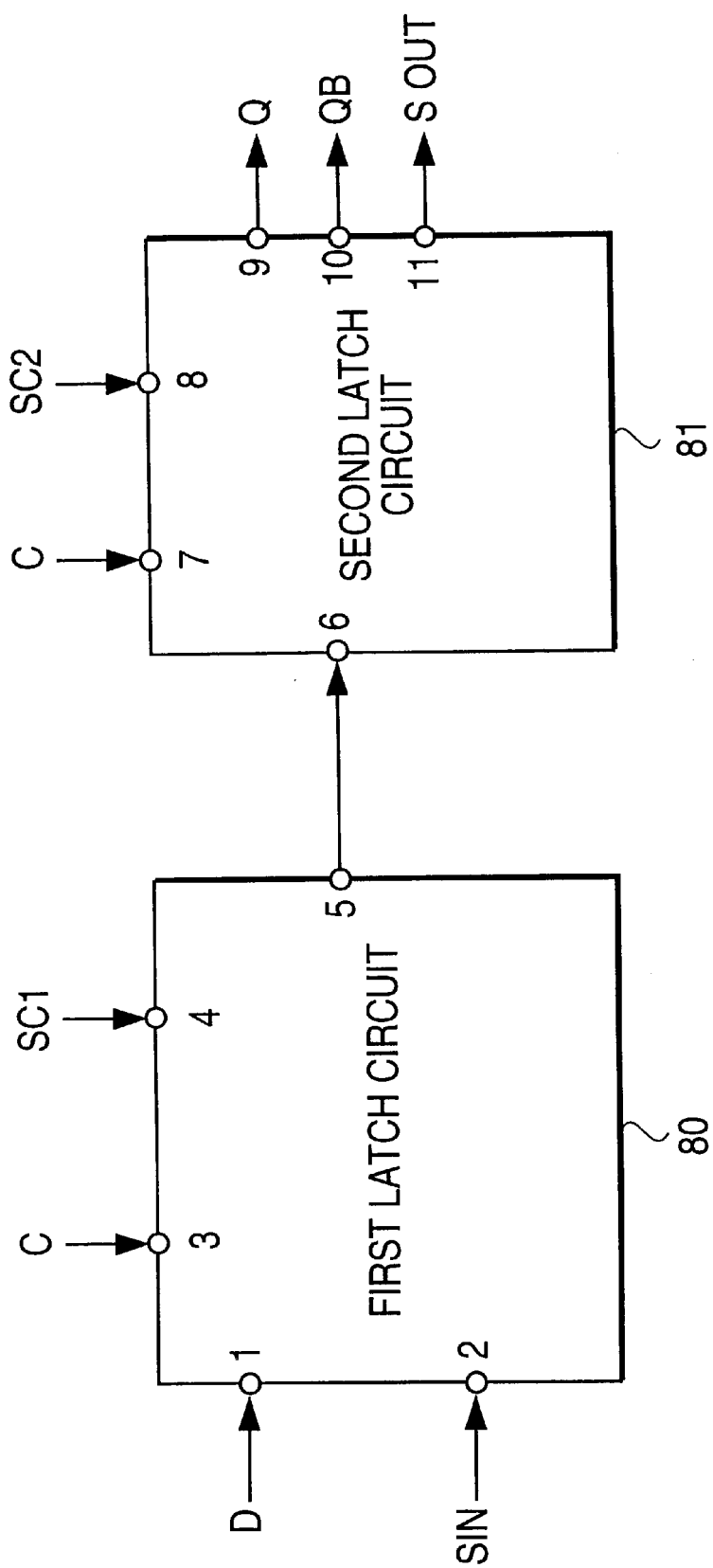
FIG. 3 is a block diagram illustrating conceptually the structure of a scan flip flop circuit in accordance with the present invention.

One embodiment of an SFF in accordance with the present invention will hereinafter be described. FIG. 3 shows a block diagram of an SFF in accordance with this embodiment, and FIGS. 4 through 7 show each circuit portion in the block. In this embodiment, as shown in FIG. 3, a latch circuit is commonly used for latching data signal D and data signal SIN, so that the latch circuitry of the SFF comprises two circuits; a first latch circuit 80 and second latch circuit 81. Next, the first and second latch circuits will be described, respectively.

Figure 4:
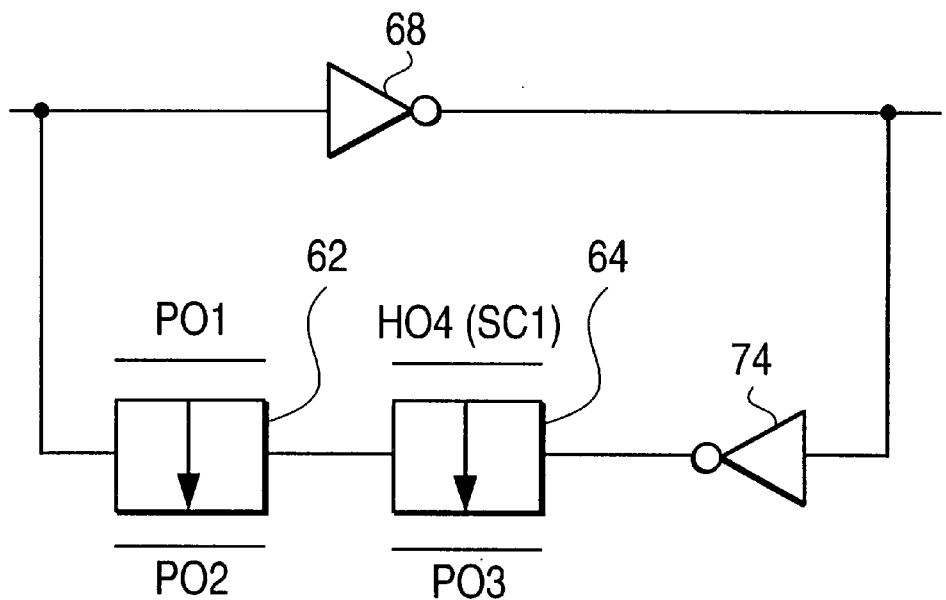
FIG. 4 is a circuit diagram of a latch portion of a first latch circuit in FIG. 3.
Figure 8:
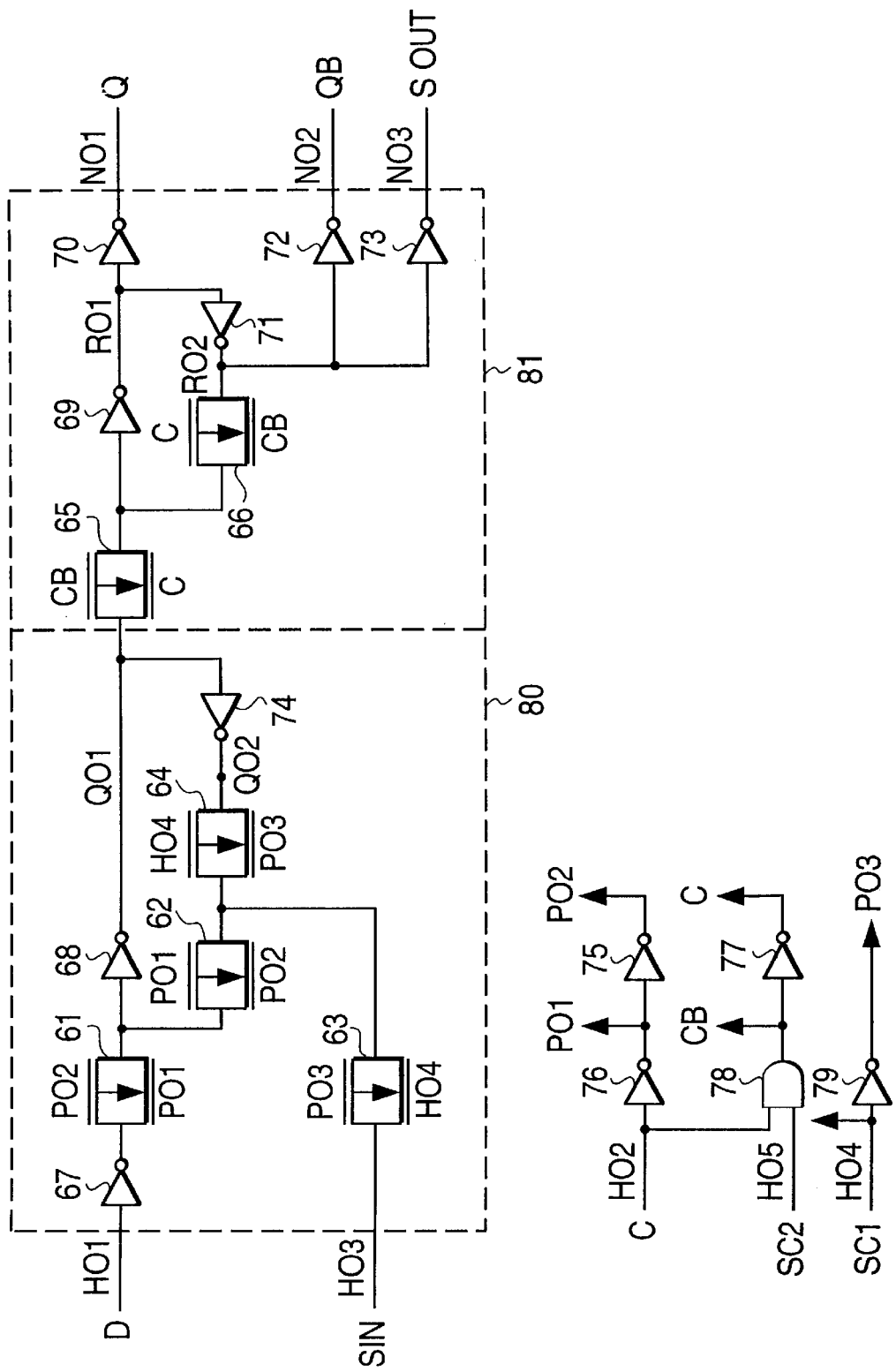
FIG. 8 is a circuit diagram illustrating the structure of an embodiment in accordance with the present invention.

FIG. 4 illustrates a latch portion of first latch circuit 80. This latch portion comprises inverters 68 and 74, and transfer gates 62 and 64. These transfer gates 62 and 64 are connected to input circuits for control signals CLK and SC1 as shown in FIG. 8. Transfer gate 64 performs a through operation when control signal SC1 is set up to 0, and performs a disconnect operation when control SC1 is set up to 1. The transfer gate 62 performs a through operation when control signal CLK is set up to 1, and performs a disconnect operation when the control signal CLK is set up to 0. An output of the transfer gate 62 is returned to an input of the inverter 68.

Figure 5:
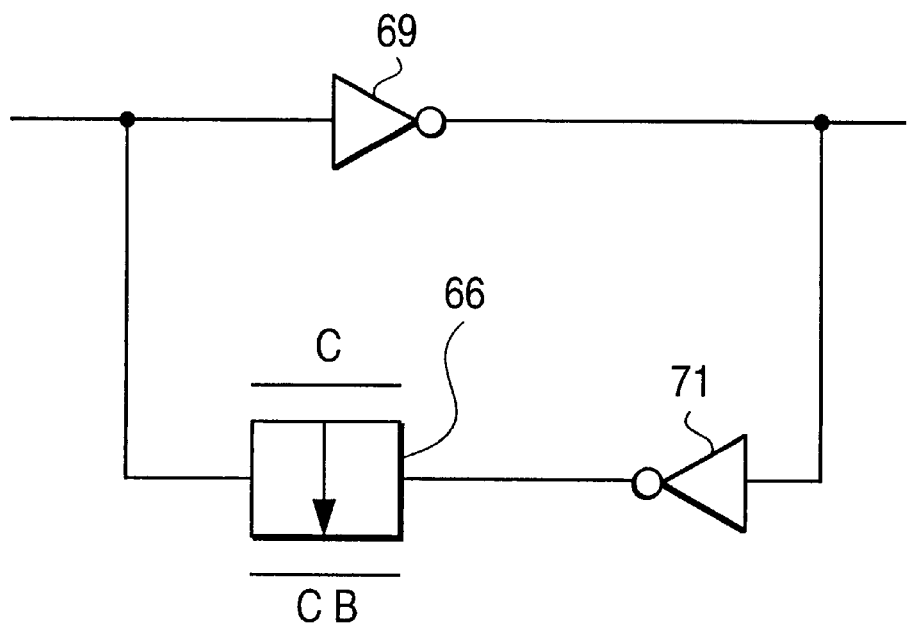
FIG. 5 is a circuit diagram of a latch portion of a second latch circuit in FIG. 3.

FIG. 5 illustrates a latch portion of second latch circuit 81. This latch portion comprises inverters 69, 71 and a transfer gate 66. This transfer gate 66 is connected to input circuits for control signals CLK and SC2 as shown in FIG. 8. Transfer gate 66 performs a through operation when NAND 78 inputted with control signals CLK and SC2 outputs 1, while it performs a disconnect operation when NAND 78 outputs 0. An output of transfer gate 66 is returned to an input of inverter 69.

Figure 6A:
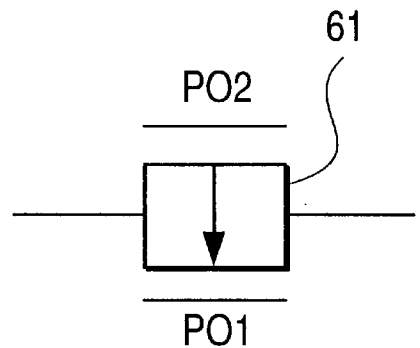
FIG. 6(a) is a circuit diagram of an input data switch portion of the first latch circuit in FIG. 3.
Figure 6B:
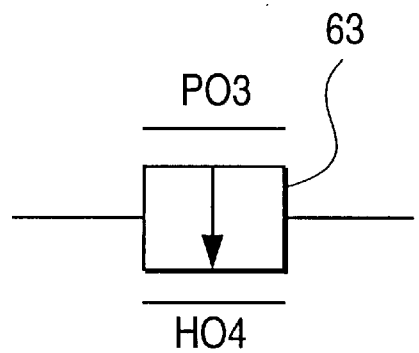
FIG. 6(b) is a circuit diagram of another input data switch portion of the first latch circuit in FIG. 3.

FIGS. 6(a) and 6(b) illustrate switch portions of first latch circuit 80 for input data D and scan in data SIN, respectively. These switch portions are connected to the input circuits for control signals CLK and SC1 similar to the latch portion. The switch portion for the input data D comprises a transfer gate 61 which performs a through operation when control signal CLK is set up to 0 and performs a disconnect operation when control signal CLK is set up to 1. Also, the switch portion for scan in data SIN comprises transfer gate 63 which performs a through operation when the control signal SC1 is set equal to 1 and performs a disconnect operation when control signal SC1 is set equal to 0.

Figure 7:
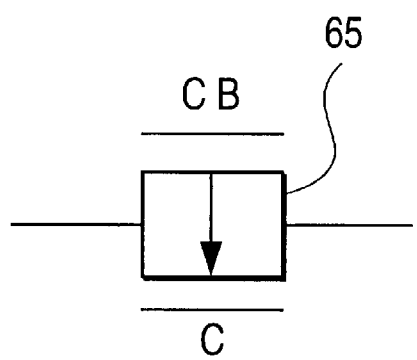
FIG. 7 is a circuit diagram of an input data switch portion of the second latch circuit in FIG. 3.

FIG. 7 illustrates a switch portion for an input data of second latch circuit 81. This switch portion is also connected to the input circuits for control signals CLK and SC2 similar to the latch portion. This switch portion comprises transfer gate 65 which performs a through operation when NAND 78 of the control signal input circuit outputs 0 and performs a disconnect operation when NAND 78 outputs 1.

Figure 1:
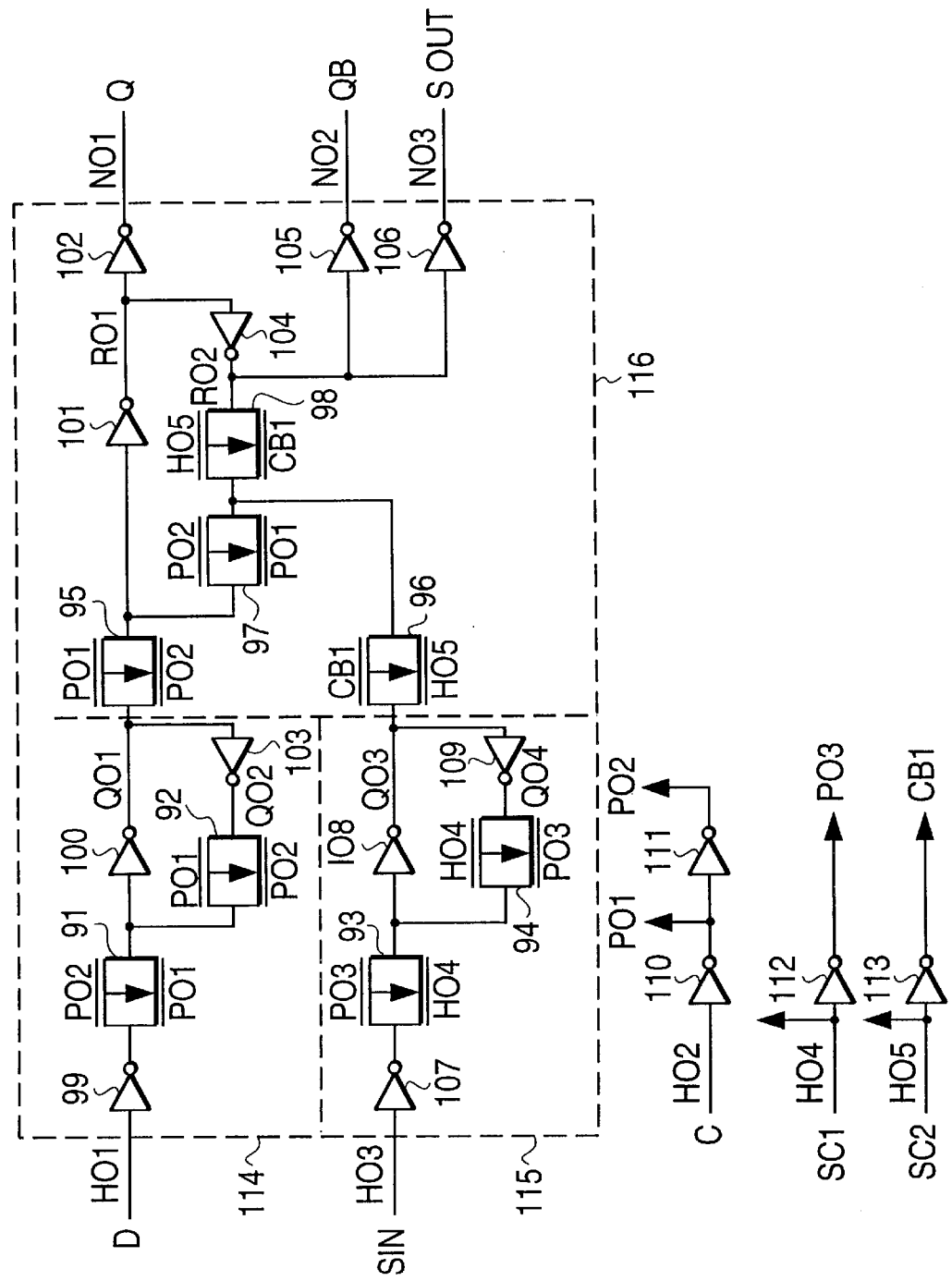
FIG. 1 is a circuit diagram illustrating a scan flip flop circuit of the prior art.
Figure 2:
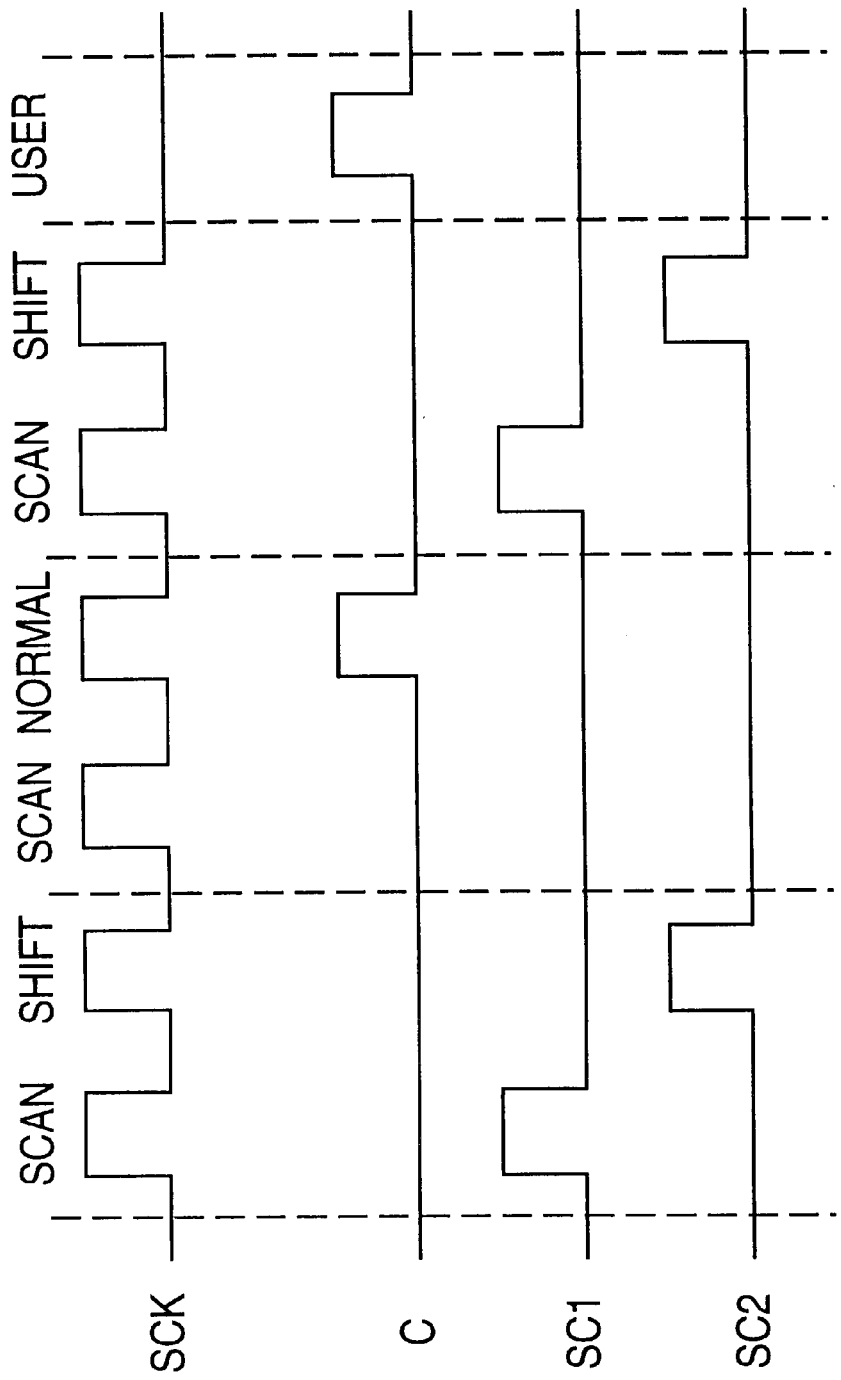
FIG. 2 is a signal waveform diagram of the prior art as shown in FIG. 1 during operation.

FIG. 8 illustrates a general circuit diagram in which the above-mentioned circuits as shown FIGS. 4 through 7 are incorporated. In this diagram, when a gate array with the same size as that of the prior art in FIG. 1 is considered, one cell is required for two transfer gates, one cell for each of output buffers 70 and 72, one cell for two inverters for the remaining inverters and one cell for NAND 78: therefore, the circuit in FIG. 8 comprises 11 cells.

Figure 9:
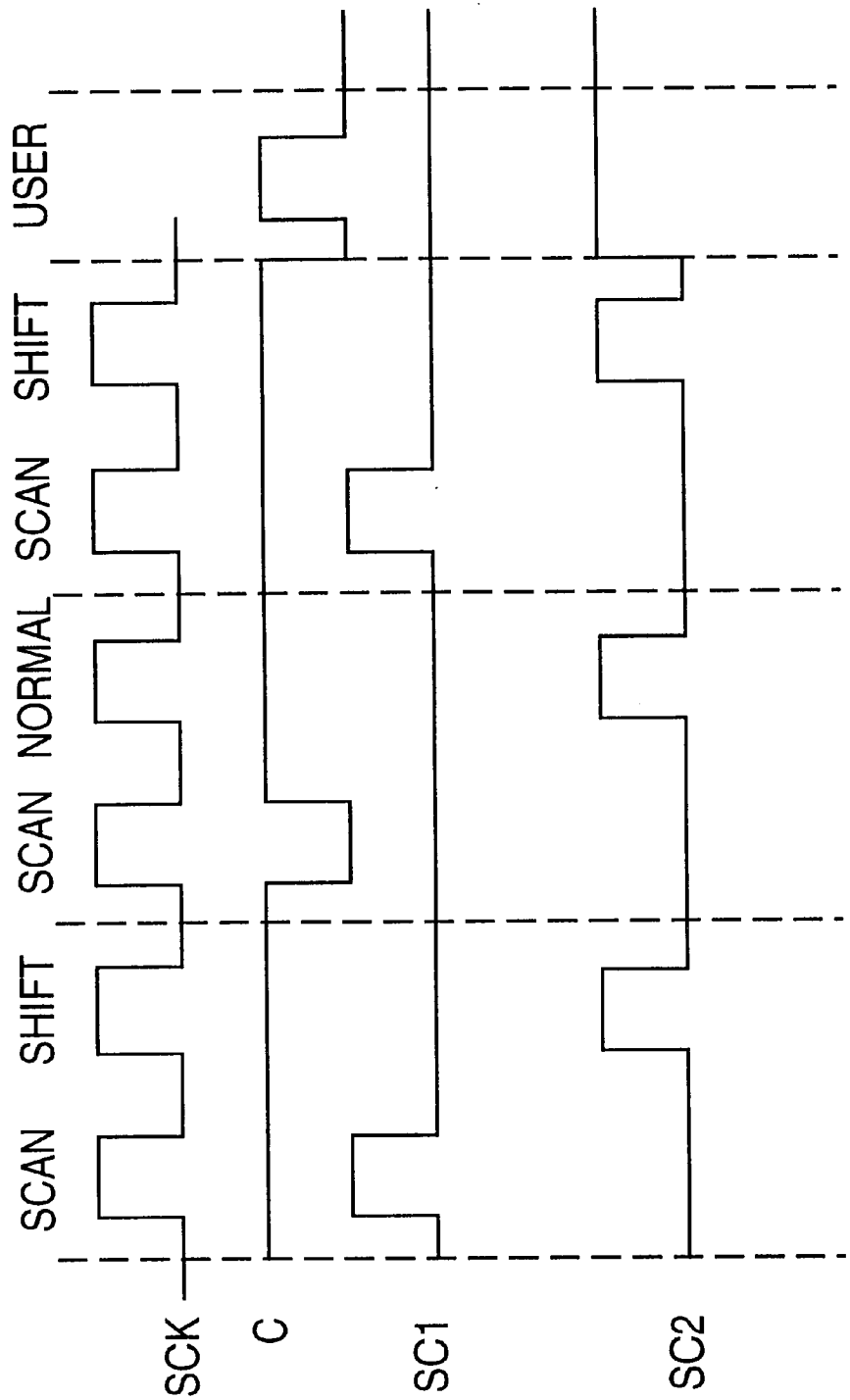
FIG. 9 is a signal waveform diagram of the embodiment as shown in FIG. 9 during operation.

FIG. 9 illustrates signal waveforms during the scan shift operation, the scan normal operation and the user made. First, the scan shift operation will be described.

In first latch circuit 80, control signals CLK and SC1 are inputted at 1 and 0, respectively, so that both transfer gates 61 and 63 are closed. When control signal SC1 is changed to 1, transfer gate 63 is opened to fetch scan in data signal SIN. Control signal SC1 is then changed to 0, transfer gate 63 is closed and transfer gate 64 is opened. At this point, control signal CLK is at 1 and transfer gate 62 is opened, so that scan in data signal SIN is latched.

During this operation, in second latch circuit 81, control signal CLK is first at 1 and control signal SC2 is at 0, so that transfer gate 65 is closed; then control signal SC2 is changed to 1, transfer gate 65 is opened to input from first latch circuit 80. Next, control signal SC2 is again changed to 0, transfer gate 65 is closed and transfer gate 66 is opened; thus the value of the input signal is latched and outputted.

As described above, the SFF in accordance with this embodiment operates with two-phase clocks SC1 and SC2 during the scan shift operation.

Next, the scan normal operation will be described.

In first latch circuit 80, control signal CLK and control signal SC1 are first inputted at 1 and 0, respectively, so that both transfer gates 61 and 63 are closed. When control signal CLK is changed to 0, transfer gate 61 is opened to fetch data signal D. Control signal CLK is then changed to 1, transfer gate 61 is closed and transfer gate 62 is opened. At this point, control signal SC1 is at 0 and transfer gate 64 is opened, so that data signal D is latched.

During this operation, in second latch circuit 81, although 1,0 and 1 are inputted in sequence as control signal CLK, transfer gate 65 is closed because control signal SC2 is inputted at 0; then control signal SC2 is changed to 1, transfer gate 65 is opened to input from first latch circuit 80. Next, control signal SC2 is again changed to 0, transfer gate 65 is closed and transfer gate 66 is opened; thus value of the input signal is latched and outputted.

In this way, the SFF in accordance with this embodiment operates with the two-phase clocks CLK and SC2 during the scan normal operation.

In other words, the SFF in accordance with the present invention always operates with the two-phase clocks during the scan test. It should be noted that the SFF in accordance with the present invention operates with the one-phase clock in a user mode similarly to the prior art.

Next, the user mode will be described.

In first latch circuit 80, control signal SC1 is first inputted at 0, so that transfer gate 63 is closed and transfer gate 64 is opened. Control signal CLK is at 0, so that transfer gate 61 is opened and transfer gate 62 is closed. In other words, data D is outputted as an output from first latch circuit 80; then control signal CLK is changed to 1 to close transfer gate 61 and to open transfer gate 62, and data signal D is latched and outputted. Next, control signal CLK is changed to 0 again to open transfer gate 61 and to close transfer gate 62.

In second latch circuit 81, control signal SC2 and control signal CLK are first inputted at 1 and 0, respectively, so that transfer gate 65 is closed and transfer gate 66 is opened. In other words, the data in the previous cycle is latched and outputted and then control signal CLK is changed to 1, transfer gate 65 is opened and transfer gate 66 is closed, and the output of first latch circuit 80 is inputted and outputted as an output of second latch circuit 81. Next, control signal CLK is again changed to 0, so that transfer gate 65 is closed and transfer gate 66 is opened and the data is latched and outputted from second latch circuit 81.

In this way, the user mode is operated with one-phase clock CLK.

As described above, in accordance with the present invention, by commonly using a latch circuit for latching data signal D and scan in data signal SIN, one latch circuit can be saved. That is to say, since the reduction in the number of cells constituting the circuit makes the area of the FF for SCAN to be reduced, increase of the area of an integrate circuit due to an incorporated SCAN circuit can be reduced.

In addition, the SFF in accordance with the present invention operates with the two-phase during the scan shift operation and the scan normal operation: therefore, skew adjustment during the scan operation is not required by setting the time interval between two-phase clocks so as to make the effect of the skew being negligible.

What is claimed is:

1. A flip flop circuit for a scan test comprising:

a first latch circuit for latching a first or a second data signal; and a second latch circuit for latching and outputting the latched signal latched in said first latch circuit, wherein said first latch circuit is provided with a first data input terminal to which said first data signal is supplied, a second data input terminal to which said second data signal is supplied, a first control signal input terminal to which a first control signal is supplied, a second control signal input terminal to which a second control signal is supplied, and a data signal output terminal for outputting said latched signal, and latches said first data signal and outputs the signal to said data signal output terminal in synchronization with said first control signal when said second control signal is set at a certain level, and latches said second data signal and outputs the signal to said data signal output terminal in synchronization with said second control signal when said first control signal is set at a certain level, and wherein said second latch circuit is provided with a third data signal input terminal to which said latched signal from said data signal output terminal is supplied, a third control signal input terminal to which a third control signal, different from said first and second control signals, is supplied, a fourth control signal input terminal to which said first control signal is supplied, and at least one data signal output terminal for outputting said latched signal from said first latch circuit, and latches said latched signal and outputs the signal to said at least one data signal output terminal in synchronization with said third control signal when said first control signal is set at the certain level.

2. The flip flop circuit for a scan test according to claim 1, wherein said first latch circuit latches said latched signal and outputs the signal to said data signal output terminal in synchronization with a fall/rise of said first control signal when said third control signal is set at a certain level, and said second latch circuit latches said latched signal and outputs the signal to at least one data signal output terminal in synchronization with the rise/fall of said first control signal when said third control signal is set at a certain level.

3. The flip flop circuit for a scan test according to claim 1, wherein said first latch circuit latches said first data signal at the time said first control signal is changed to a first logical level while said second control signal is set at the first logical level, and latches said second data signal at the time said second control signal is changed to a second logical level while said first control signal is set at the second logical level.

4. The flip flop circuit for a scan test according to claim 1, wherein said second latch circuit latches said latched signal at the time said third control signal is changed to said second logical level while said first control signal is set at the second logical level.

5. A flip flop circuit for a scan test comprising:

a first latch circuit for latching a first or a second data signal; and second latch circuit for latching and outputting the latched signal latched in said first latch circuit, wherein said first latch circuit is provided with a first data input terminal to which said first data signal is supplied, a second data input terminal to which said second data signal is supplied, a first control signal input terminal to which a first control signal is supplied, a second control signal input terminal to which a second control signal is supplied, and a data signal output terminal for outputting said latched signal, and latches said first data signal and outputs the signal to said data signal output terminal in synchronization with said first control signal when said second control signal is set at a certain level, and latches said second data signal and outputs the signal to said data signal output terminal in synchronization with said second control signal when said first control signal is set at a certain level, and wherein said second latch circuit is provided with a third data signal input terminal to which said latched signal from said data signal output terminal is supplied, a third control signal input terminal to which a third control signal, different from said first and second control signals, is supplied, a fourth control signal input terminal to which said first control signal is supplied, and at least one data signal output terminal for outputting said latched signal from said first latch circuit, and latches said latched signal and outputs the signal to said at least one data signal output terminal in synchronization with said third control signal when said first control signal is set at the certain level, wherein said first latch circuit latches said first data signal at the time said first control signal is changed to a first logical level while said second control signal is set at the first logical level, and latches said second data signal at the time said second control signal is changed to a second logical level while said first control signal is set at the second logical level, and wherein said first latch circuit comprises a first inverter, a first switching portion connected to said first data input terminal via said first inverter, a second switching portion connected to said second data input terminal and a first latch portion, said first switching portion makes a current path through when said first control signal is at said first logical level and disconnects the current path when said first control signal is at said second logical level, said second switching portion makes the current path through when said second control signal is at said second logical level and disconnects the current path when said second control signal is at said first logical level, and said first latch portion comprises a first means for making the current path through when said second control signal is at said first logical level and for disconnecting the current path when said second control signal is at said second logical level, a second means for making the current path through when said first control signal is at said second logical level and for disconnecting the current path when said first control signal is at said first logical level, a second inverter and a third inverter, outputs of both said second switching portion and said first means and an input of said second means being connected at a first node, outputs of both said first switching portion and said second means and an input of said second inverter being connected at a second node, an output of said second inverter, said data signal output terminal and an input of said third inverter being connected at a third node, and an output of said third inverter being connected to an input of said first means.

6. A flip flop circuit for a scan test comprising:

a first latch circuit for latching a first or a second data signal; and a second latch circuit for latching and outputting the latched signal latched in said first latch circuit, wherein said first latch circuit is provided with a first data input terminal to which said first data signal is supplied, a second data input terminal to which said second data signal is supplied, a first control signal input terminal to which a first control signal is supplied, a second control signal input terminal to which a second control signal is supplied, and a data signal output terminal for outputting said latched signal, and latches said first data signal and outputs the signal to said data signal output terminal in synchronization with said first control signal when said second control signal is set at a certain level, and latches said second data signal and outputs the signal to said data signal output terminal in synchronization with said second control signal when said first control signal is set at a certain level, and wherein said second latch circuit is provided with a third data signal input terminal to which said latched signal from said data signal output terminal is supplied, a third control signal input terminal to which a third control signal, different from said first and second control signals, is supplied, a fourth control signal input terminal to which said first control signal is supplied, and at least one data signal output terminal for outputting said latched signal from said first latch circuit, and latches said latched signal and outputs the signal to said at least one data signal output terminal in synchronization with said third control signal when said first control signal is set at the certain level, wherein said second latch circuit latches said latched signal at the time said third control signal is changed to said second logical level while said first control signal is set at the second logical level, wherein said second latch circuit comprises a third switching portion connected to said third data signal input terminal and a second latch portion, said third switching portion makes the current path through when an output of a NAND having two inputs of said first control signal and said third control signal is at said first logical level and disconnects the current path when said NAND output is at said second logical level, said second latch portion is provided with a third means for making the current path through when said NAND output is at said second logical level and for disconnecting the current path when said NAND output is at said first logical level, a fourth inverter and a fifth inverter, outputs of both said third switching portion and said third means and an input of said fourth inverter being connected at a fourth node, an output of said fourth inverter and an input of said fifth inverter are connected at a fifth, node an output of said fifth inverter and an input of said third means being connected at a sixth, node said fifth node and said sixth node being individually connected to said at least one data signal output terminal.

* * * * *